United States Patent
Kim et al.

(10) Patent No.: US 10,164,299 B2
(45) Date of Patent: Dec. 25, 2018

(54) FLEXIBLE SENSOR MODULE AND MANUFACTURING METHOD THEREOF

(71) Applicant: LG ELECTRONICS INC., Seoul (KR)

(72) Inventors: Soohyun Kim, Seoul (KR); Wonki Yoon, Seoul (KR); Chaedeok Lee, Seoul (KR); Heonmin Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 267 days.

(21) Appl. No.: 15/284,051

(22) Filed: Oct. 3, 2016

(65) Prior Publication Data

US 2017/0214100 A1    Jul. 27, 2017

(30) Foreign Application Priority Data

Jan. 26, 2016  (KR) .................. 10-2016-0009628

(51) Int. Cl.
*H01L 21/00* (2006.01)
*H01M 10/46* (2006.01)
(Continued)

(52) U.S. Cl.
CPC .......... *H01M 10/465* (2013.01); *G01D 11/30* (2013.01); *H01L 31/022425* (2013.01); *H01L 31/048* (2013.01); *Y02E 10/50* (2013.01)

(58) Field of Classification Search
CPC .......... H01L 31/022425; H01L 31/048; Y02E 10/50; H01M 10/465; G01D 11/30
See application file for complete search history.

(56) References Cited

U.S. PATENT DOCUMENTS

2001/0032666 A1* 10/2001 Jenson ............... A61N 1/3787
                                                                136/256
2016/0270220 A1*  9/2016 Omote ................. H01L 31/048
2018/0076341 A1*  3/2018 Faur ................. H01L 31/02168

FOREIGN PATENT DOCUMENTS

JP     2013-122718 A     6/2013
KR  10-2011-0061074 A    6/2013
(Continued)

OTHER PUBLICATIONS

Shahrjerdi et al., "Ultralight High-Efficiency Flexible InGaP/(In) GaAs Tandem Solar Cells on Plastic," Advanced Energy Materials, vol. 3, No. 5, 2013 (Published online: Dec. 13, 2012), pp. 566-571.

*Primary Examiner* — Richard A Booth
(74) *Attorney, Agent, or Firm* — Birch, Stewart, Kolasch & Birch, LLP

(57) ABSTRACT

A flexible sensor module, includes: a sensing unit formed on a first substrate so as to be exposed to the outside, and configured to measure external environment information; a solar cell disposed on the first substrate together with the sensing unit, and configured to generate a power by receiving light; a wireless communication unit disposed at one side on the first substrate, and configured to transmit the information measured by the sensing unit to an external server; and a chemical cell disposed at another side on the first substrate, charged by receiving the power from the solar cell, and configured to supply the power to the sensing unit and the wireless communication unit, wherein the solar cell includes: a compound layer disposed on the second substrate, and configured to generate the power to be supplied to the sensing unit by receiving light; and a metallic electrode formed on the compound layer.

16 Claims, 7 Drawing Sheets

(51) Int. Cl.
    *G01D 11/30*     (2006.01)
    *H01L 31/0224*     (2006.01)
    *H01L 31/048*     (2014.01)

(56) References Cited

FOREIGN PATENT DOCUMENTS

| | | |
|---|---|---|
| KR | 10-2013-0110726 A | 10/2013 |
| KR | 10-2015-0140183 A | 12/2014 |
| KR | 10-2015-0080824 A | 7/2015 |

\* cited by examiner

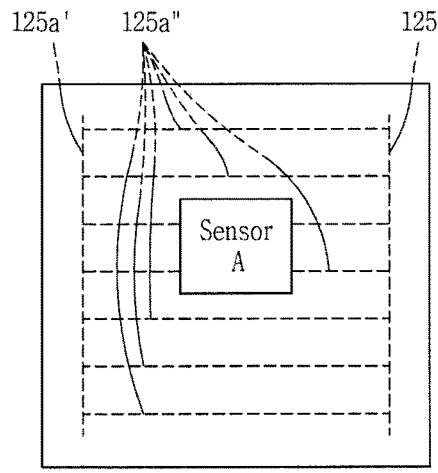
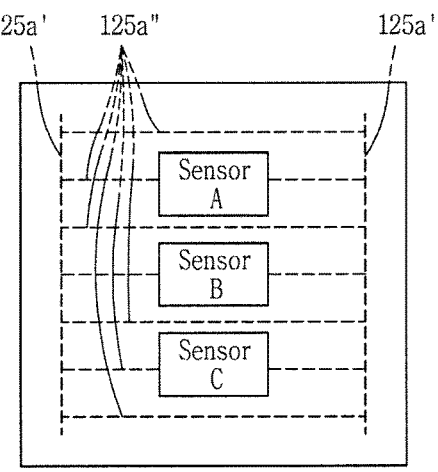
FIG. 8A  FIG. 8B
FIG. 9
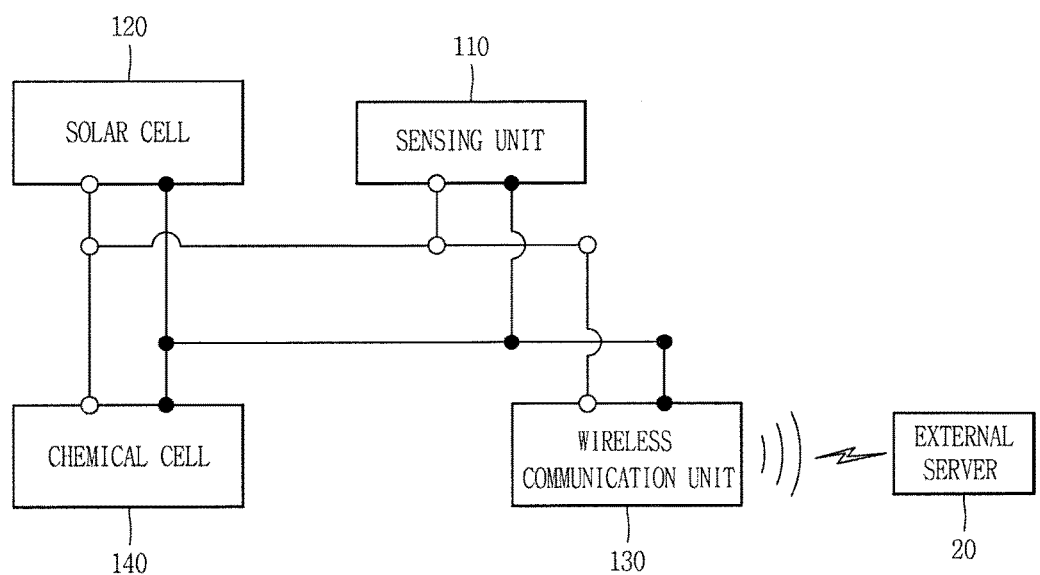

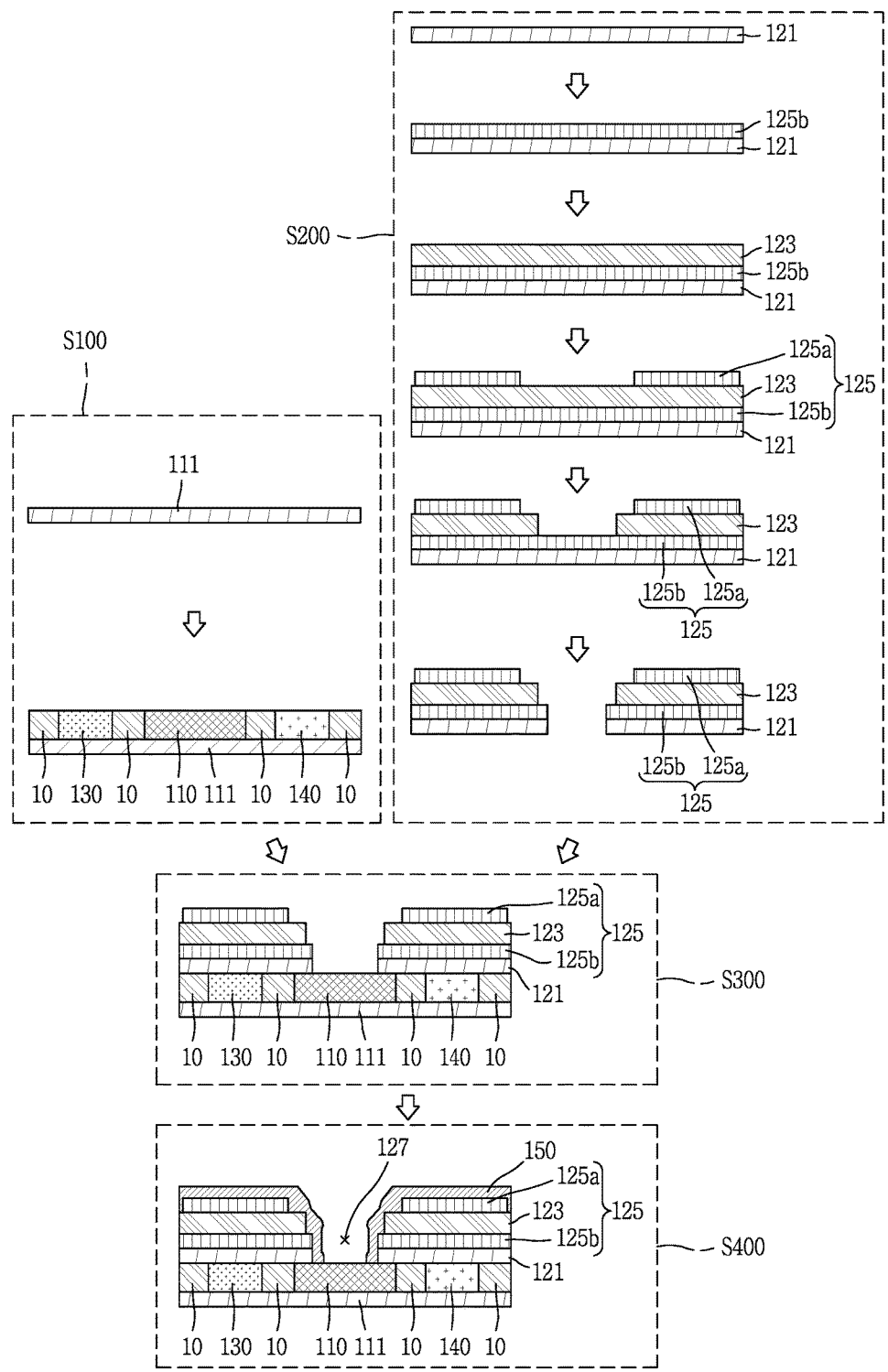

FLEXIBLE SENSOR MODULE AND MANUFACTURING METHOD THEREOF

CROSS-REFERENCE TO RELATED APPLICATION

Pursuant to 35 U.S.C. § 119(a), this application claims the benefit of an earlier filing date of and the right of priority to Korean Application No. 10-2016-0009628, filed on Jan. 26, 2016, the contents of which are incorporated by reference herein in its entirety.

BACKGROUND OF THE INVENTION

1. Field of the Invention

The present invention relates to a sensor module including a solar cell, and a method for manufacturing the same.

2. Background of the Invention

In order to enhance utilization of an apparatus for sensing various information such as a temperature, a humidity, a gas concentration and an illuminance, required is a sensor module formed as various sensors are integrated with each other. The sensor module means an apparatus where a sensing unit, a power unit, a communication unit, etc. are integrated with each other.

In order to drive each sensor included in the sensor module, an additional energy source is required. As the additional energy source, a primary cell, a chemical cell has been used. However, the chemical cell degrades a user's convenience since it requires periodic charging or replacements. In order to solve such a problem, may be implemented a sensor module including a solar cell not requiring additional replacement or charging of energy. In this case, a solar cell of high efficiency is required such that the solar cell is used as an energy source of the sensor module. In the case where the sensor module has the solar cell therein, the size of the sensor module may be increased. This may cause a restriction in an installation position of the sensor module.

Accordingly, required is a sensor module having a novel structure where the sensor module does not have a size increase due to an integrated configuration, and where the sensor module is installable on a curved surface due to its flexible characteristic.

SUMMARY OF THE INVENTION

Therefore, an aspect of the detailed description is to provide a flexible sensor module having a solar cell for driving, the solar cell configured to supply energy to the flexible sensor module.

Another aspect of the detailed description is to provide a new structure to integrate a flexible sensor module.

Another aspect of the detailed description is to provide a method of manufacturing a flexible sensor module having such a structure.

To achieve these and other advantages and in accordance with the purpose of this specification, as embodied and broadly described herein, there is provided a flexible sensor module, including: a sensing unit formed on a first substrate so as to be exposed to the outside, and configured to measure external environment information; a solar cell disposed on the first substrate together with the sensing unit, and configured to generate a power by receiving light; a wireless communication unit disposed at one side on the first substrate, and configured to transmit the information measured by the sensing unit to an external server; and a chemical cell disposed at another side on the first substrate, charged by receiving the power from the solar cell, and configured to supply the power to the sensing unit and the wireless communication unit, wherein the solar cell includes: a compound layer disposed on the second substrate, and configured to generate the power to be supplied to the sensing unit by receiving light; and a metallic electrode formed on the compound layer.

In an embodiment of the present invention, the sensing unit, the solar cell, the wireless communication unit, and the chemical cell may be disposed at different positions on the first substrate.

In an embodiment of the present invention, the solar cell may be disposed on at least one of the wireless communication unit and the chemical cell, in order to absorb light in an exposed state to the outside.

In an embodiment of the present invention, the metallic electrode may connect the solar cell, the sensing unit, the wireless communication unit, and the chemical cell to each other. And the metallic electrode may include: an upper metallic electrode formed on the compound layer; and a lower metallic electrode disposed between the second substrate and the compound layer, and disposed on an opposite side to the upper metallic electrode on the basis of the compound layer.

In an embodiment of the present invention, the sensing unit may measure at least one of a temperature, a humidity, a gas concentration and an illuminance of the outside, in an exposed state to the outside.

In an embodiment of the present invention, the compound layer may be formed as a layer of a compound of one element of group 3 and another element of group 5.

In an embodiment of the present invention, the elements of group 3 and group 5 may be formed as gallium (Ga) and arsenic (As).

According to another aspect of the present invention, there is provided a flexible sensor module, including: a sensing unit formed on a first substrate, and configured to measure external environment information; a solar cell disposed on the first substrate together with the sensing unit; a wireless communication unit disposed on the first substrate together with the solar cell, and configured to transmit information measured by the sensing unit to an external server; and a chemical cell disposed on the first substrate together with the wireless communication unit, charged by receiving a power from the solar cell, and configured to supply the power to the sensing unit and the wireless communication unit, wherein the solar cell includes: a second substrate disposed to face the first substrate; a compound layer disposed on the second substrate, and configured to generate the power to be supplied to the sensing unit by receiving light; a metallic electrode formed on the compound layer; and one or more through holes formed to pass through upper and lower parts of the solar cell, such that the sensing unit is exposed to the outside.

In an embodiment of the present invention, the metallic electrode may connect the solar cell, the sensing unit, the wireless communication unit, and the chemical cell to each other. And the metallic electrode may include: an upper metallic electrode formed on the compound layer; and a lower metallic electrode disposed between the second substrate and the compound layer, and disposed on an opposite side to the upper metallic electrode on the basis of the compound layer.

In an embodiment of the present invention, the solar cell may be disposed such that the second substrate, the lower metallic electrode, the compound layer and the upper metallic electrode are sequentially laminated, at both sides on the basis of the through hole, in a facing manner.

In an embodiment of the present invention, the sensing unit may measure at least one of a temperature, a humidity, a gas concentration and an illuminance of the outside, in an exposed state to the outside via each of the through holes.

In an embodiment of the present invention, the flexible sensor module may further include a sealing unit configured to cover the solar cell in order to prevent the solar cell from being exposed to the outside.

In an embodiment of the present invention, the flexible sensor module may further include a signal amplifier formed on the first substrate together with the sensing unit, and configured to amplify a signal measured by the sensing unit.

To achieve these and other advantages and in accordance with the purpose of this specification, as embodied and broadly described herein, there is also provided a method of manufacturing a flexible sensor module, the method including: a first step of forming a half-finished product by laminating a sensing unit, a chemical cell and a wireless communication unit on a first substrate; and a second step of forming a solar cell, wherein the second step includes: forming a lower metallic electrode on a second substrate facing the first substrate; forming a compound layer of one element of group 3 and another element of group 5, on the lower metallic electrode; forming an upper metallic electrode on the compound layer of elements of groups 3, 5, such that part of the compound layer of elements of groups 3, 5 is exposed to the outside; and forming a through hole so as to pass through the second substrate, the lower metallic electrode, the compound layer of elements of groups 3, 5, and the upper metallic electrode which are laminated on each other, wherein the method further includes a third step of coupling the solar cell onto the half-finished product after firstly forming the half-finished product and then forming the solar cell, or after firstly forming the solar cell and then forming the half-finished product.

In an embodiment of the present invention, the forming a through hole may include: a step of exposing the lower metallic electrode to the outside by removing part of the compound layer of elements of groups 3, 5 exposed to the outside; and a step of exposing the sensing unit to the outside by punching the lower metallic electrode and the second substrate.

In an embodiment of the present invention, the method may further include a fourth step of covering the solar cell by a sealing unit, for prevention of contact between the solar cell coupled onto the half-finished product and air.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIGS. 8A and 8B are conceptual views illustrating a sensing unit and an upper metallic electrode, exposed to the outside via a through hole of FIG. 7;

FIG. 9 is a conceptual view illustrating a connection state of components of a flexible sensor module;

FIG. 10 is a conceptual view illustrating a method of manufacturing a flexible sensor module.

DETAILED DESCRIPTION OF THE INVENTION

Description will now be given in detail of preferred configurations of a flexible sensor module according to the present invention, with reference to the accompanying drawings.

For the sake of brief description with reference to the drawings, the same or equivalent components will be provided with the same reference numbers, and description thereof will not be repeated. A singular expression in the specification includes a plural meaning unless it is contextually definitely represented.

Figure 1:
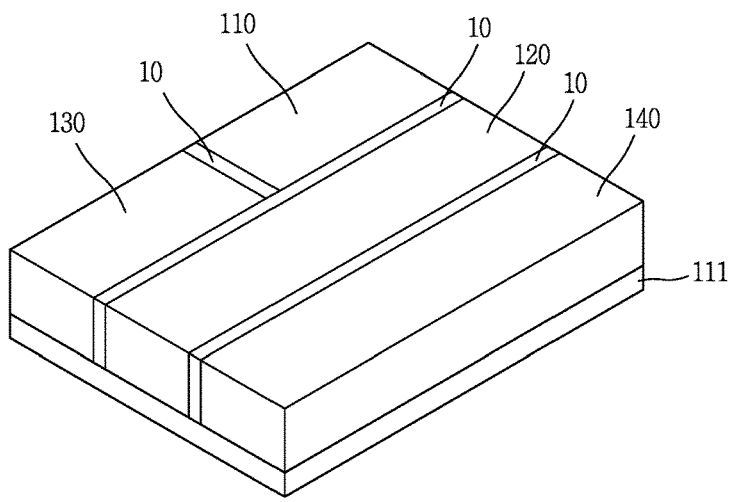
FIG. 1 is a perspective view of a flexible sensor module including a solar cell according to an embodiment of the present invention.
Figure 2:
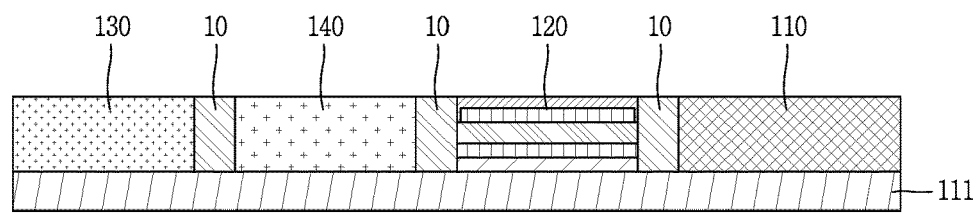
FIG. 2 is a side sectional view illustrating a structure of the flexible sensor module of FIG. 1.

FIG. 1 is a perspective view of a flexible sensor module 100, and FIG. 2 is a side sectional view illustrating a structure of the flexible sensor module 100 of FIG. 1.

The flexible sensor module 100 includes a sensing unit 110, a solar cell 120, a wireless communication unit 130 and a chemical cell 140. As shown in FIG. 1, the components are laminated on the same substrate. Referring to FIG. 1, the flexible sensor module 100 has a structure where the sensing unit 110, the solar cell 120, the wireless communication unit 130 and the chemical cell 140 are disposed on a first substrate 111.

The flexible sensor module 100 is configured to collect external environment information by the sensing unit 110, and to transmit the information to the outside through the wireless communication unit 130. In a light environment, the flexible sensor module 100 executes the function by receiving a power through the solar cell 120. On the other hand, in a no-light environment, the flexible sensor module 100 is normally operated by storing part of a power generated by the solar cell 120 in the chemical cell 140.

The sensing unit 110, the solar cell 120, the wireless communication unit 130 and the chemical cell 140 are disposed on the first substrate 111. In this case, the position and the arrangement state of the components may be variable. That is, the present invention is not limited to the structure and the arrangement state shown in FIG. 1. For instance, the components may be positioned on the first substrate 111 in an arbitrary order, as long as they are positioned on the same substrate.

The substrate of the present invention is configured to support the respective components, and to electrically connect the components to each other through connection lines formed thereon. Since the substrate of the present invention has a flexible characteristic, the flexible sensor module 100 may be mounted to a wall surface or a device each having a curved surface.

The substrate includes a first substrate 111 and a second substrate 121. The first substrate 111 and the second substrate 121 are formed of a synthetic resin having a thickness less than 1 mm, and have a bendable or flexible characteristic. However, the first substrate 111 and the second substrate 121 are not limited to this.

FIG. 2 illustrates each component of the flexible sensor module 100. The components of the flexible sensor module 100, and a reciprocal operation thereof will be explained.

The sensing unit 110 may be fixed onto the first substrate 111 through various means such as lead or a synthetic resin. The sensing unit 110, configured to measure external environment information, measures at least one of a temperature, a humidity, a gas concentration and an illuminance of the outside, in an exposed state to the outside. For this, the sensing unit 110 may include at least one of a temperature sensor, a humidity sensor, a gas concentration measuring sensor and an illuminance sensor. Alternatively, the sensing unit 110 may be implemented as an integrated sensor of the respective sensors, or may be implemented as a plurality of different sensors.

The sensing unit 110 may measure a gas concentration, a temperature, a humidity, an illuminance, etc. according to a usage purpose, and may execute various functions as a plurality of sensors are coupled thereto. The sensing unit 110 may have any structure and any shape. However, since the sensing unit 110 is implemented in the form of a module, it is preferable for the sensing unit 110 to include a flexible substrate.

As shown in FIG. 2, the sensing unit 110 is positioned so as to be exposed to the outside, since it should measure external environment information.

The wireless communication unit 130 may be positioned at one side on the first substrate 111, or may be positioned on the same plane together with the sensing unit 110 disposed at one side on the first substrate 111. The wireless communication unit 130, configured to transmit information measured by the sensing unit 110 to an external server, may execute a wireless communication function by selecting a wide range of frequency of about 1.56 MHz~2.54 GHz. Information about a temperature, a gas concentration, an illuminance, a humidity, etc. each measured by the sensing unit 110 may be transmitted to an external server through the wireless communication unit 130. And a user may check the transmitted information through various devices such as a computer, a smart phone and a notebook.

Preferably, the wireless communication unit 130 may be formed to have a thickness less than 1 mm for a flexible characteristic. The wireless communication unit 130 may be disposed at any position since it needs not be exposed to the outside. As shown in FIG. 2, the wireless communication unit 130 is fixed at one side on the first substrate 111 by using lead, a synthetic resin, etc. That is, the wireless communication unit 130 is positioned on the same plane as the sensing unit 110.

The chemical cell 140, configured to supply a power to each component of the flexible sensor module 100 by converting chemical energy into electric energy, may be implemented as a secondary cell including zinc (Zn), lithium (Li), etc. The chemical cell 140 may be formed to have a thickness less than 1 mm for a flexible characteristic. In an environment where the solar cell 120 cannot generate a power, the chemical cell 140 supplies a power stored therein to the sensing unit 110 and the wireless communication unit 130 such that the sensing unit 110 and the wireless communication unit 130 are operated.

The chemical cell 140 may be positioned at one side on the first substrate 111, and may be positioned on the same plane as the sensing unit 110 and the wireless communication unit 130. The chemical cell 140 is charged by receiving a power from the solar cell 120, and the power is used to operate the sensing unit 110 and the wireless communication unit 130, in a case where the solar cell 120 cannot absorb light to thus generate no power.

If the solar cell 120 has a difficulty in operation in a no light environment, the chemical cell 140 provides the power stored therein to the sensing unit 110 and the wireless communication unit 130 to operate them. The chemical cell 140 may be disposed at any position. Referring to FIG. 2, the chemical cell 140 is disposed on the same plane as the sensing unit 110, the wireless communication unit 130 and the solar cell 120.

As shown in FIGS. 1 and 2, the sensing unit 110, the wireless communication unit 130 and the solar cell 120 may be disposed at specific positions on the first substrate 111, as a bonding material 10 is interposed therebetween.

Figure 3:
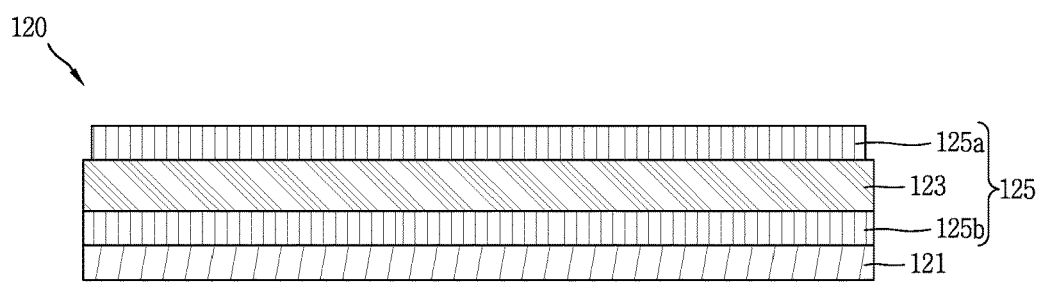
FIG. 3 is a side sectional view illustrating a structure of a solar cell.
Figure 4:
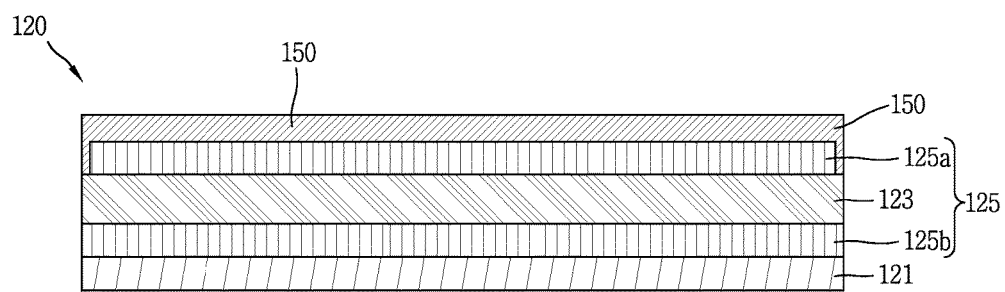
FIG. 4 is a side sectional view illustrating that a sealing unit covers the solar cell of FIG. 3 from an upper side.

FIGS. 3 and 4 illustrate a structure of the solar cell 120.

The solar cell 120, serving to convert solar energy into electric energy, is configured to convert light energy generated from the sun into electric energy. As shown in FIGS. 1 and 2, the solar cell 120 is positioned at one side on the first substrate 111, and is positioned on the same plane as the sensing unit 110, the wireless communication unit 130 and the chemical cell 140.

The solar cell 120 includes a second substrate 121, a compound layer 123, and a metallic electrode 125.

Since the solar cell 120 is disposed on the first substrate 111, the second substrate 121 faces the first substrate 111. The second substrate 121 supports the compound layer 123 and the metallic electrode 125 thereon. The second substrate 121 is connected to the first substrate 111 through a copper electrode formed thereat, and is connected to the sensing unit 110, the chemical cell 140 and the wireless communication unit 130. The second substrate 121 has the same configuration as the first substrate 111.

Once light is incident onto the compound layer 123 of the solar cell 120, electrons and holes are generated by light energy. In case of a p-type semiconductor device, a large number of carriers form holes, and a small number carriers form electrons. Electrons and holes are generated by light, and the generated electrons and holes spread to the periphery by a density difference therebetween. Once a potential difference reaches a p-n bonding unit, the electrons and the holes are separated from each other by a strong electric field. The electrons dispersed in the p-type semiconductor device move to an n-type semiconductor device, and the holes dispersed in the n-type semiconductor device move to the p-type semiconductor device. And power may be generated by a current flow principle. In the present invention, an upper metallic electrode 125a and a lower metallic electrode 125b of the solar cell 120 serve as an 'n' layer and a 'p' layer, respectively.

The compound layer 123 is positioned on the second substrate 121, and generates a power by separating electrons and holes from each other by receiving light. The compound layer 123 is formed as a layer of a compound of one element of group 3 and another element of group 5. More specifically, the compound layer 123 is formed as one element of group 3 and another element of group 5 of the periodic table are combined to each other. Gallium (Ga) may be used as the element of group 3, and arsenic (As) may be used as the element of group 5. The compound layer 123 may be formed to have a thin film of a thickness less than about 3 μm, for a flexible characteristic.

The solar cell 120 including Ga and As generates a large amount of electricity than the conventional Si-based solar cell. In this case, a higher power generation amount may be provided even in an environment where illuminance is low (e.g., 400 lux).

The solar cell 120 including Ga and As may have high generation efficiency even at a small thickness less than 3 μm, and has a flexible characteristic due to its bending characteristic. Accordingly, the flexible sensor module may have a compact configuration and a small weight.

Referring to FIGS. 3 and 4, the metallic electrode 125 is formed on the surface of the compound layer 123, and includes an upper metallic electrode 125a and a lower metallic electrode 125b.

The upper metallic electrode 125a is disposed on the compound layer 123, and includes a finger 125a' (refer to FIG. 8) and a busbar 125a" (refer to FIG. 8). The lower metallic electrode 125b is disposed between the second substrate and the compound layer 123, and is disposed on an opposite side to the upper metallic electrode 125a on the basis of the compound layer 123.

The upper metallic electrode 125a and the lower metallic electrode 125b serve as electrodes which form electrons and holes on front and rear surfaces of the compound layer 123, in order to collect charges formed by light. In the present invention, the upper metallic electrode 125a forms an 'n' layer, and the lower metallic electrode 125b forms a 'p' layer.

The upper metallic electrode 125a and the lower metallic electrode 125b are formed by using a metallic paste. The upper metallic electrode 125a is formed by using an aluminum (Al) paste, and the lower metallic electrode 125b is formed by using a silver (Ag) paste.

Once solar energy is irradiated to the solar cell 120, a photoelectric effect is generated by a reciprocal operation among the compound layer 123, the upper metallic electrode 125a and the lower metallic electrode 125b, and thus an electromotive force is generated. The generated electromotive force is stored in the chemical cell 140 or is connected to a device which requires a power. The photoelectric effect means generating electric charges by absorbing light.

As shown in FIG. 4, the flexible sensor module 100 may further include a sealing unit 150 configured to cover the solar cell 120 in order to prevent the solar cell 120 from being exposed to the outside. The sealing unit 150 is disposed on the solar cell 120. The sealing unit 150 may be formed of a transparent synthetic resin in order to prevent water penetration into the solar cell 120 or contamination of the solar cell 120 due to exposure of the solar cell 120 to the outside. For instance, the sealing unit 150 may be formed of a PVC material.

Figure 5:
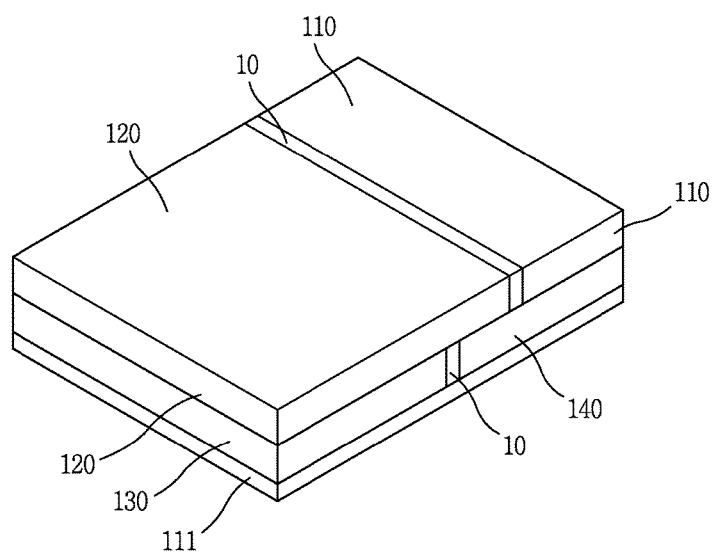
FIG. 5 is a perspective view illustrating a flexible sensor module including a solar cell according to another embodiment of the present invention.

FIG. 5 is a perspective view illustrating a flexible sensor module 100 according to another embodiment of the present invention.

The flexible sensor module 100 includes a sensing unit 110, a solar cell 120, a wireless communication unit 130 and a chemical cell 140. The components are laminated on a substrate. Unlike the flexible sensor module 100 where the components are disposed on the same plane, the flexible sensor module 100 of FIG. 5 has a structure where other components are laminated on some components.

As shown in FIG. 5, the chemical cell 140 and the wireless communication unit 130 are disposed at a lower part of the flexible sensor module 100, and the sensing unit 110 and the solar cell 120 may be disposed on the chemical cell 140 and the wireless communication unit 130.

Referring to FIG. 5, the wireless communication unit 130 is disposed below the solar cell 120, and the chemical cell 140 is disposed below the sensing unit 110. The positions of the solar cell 120 and the sensing unit 110 may be interchanged with each other. However, the solar cell 120 and the sensing unit 110 should be positioned so as to be exposed to the outside, because the solar cell 120 should generate a power by absorbing light from the outside and the sensing unit 110 should measure external environment information. The chemical cell 140 and the wireless communication unit 130 need not be positioned so as to be exposed to the outside, because they can perform functions without being exposed to the outside. That is, the solar cell 120 may be positioned on at least one of the wireless communication unit 130 and the chemical cell 140, in order to absorb light in an exposed state to the outside. And the sensing unit 110 may be positioned on at least one of the wireless communication unit 130 and the chemical cell 140, in order to measure external environment information.

Figure 6:
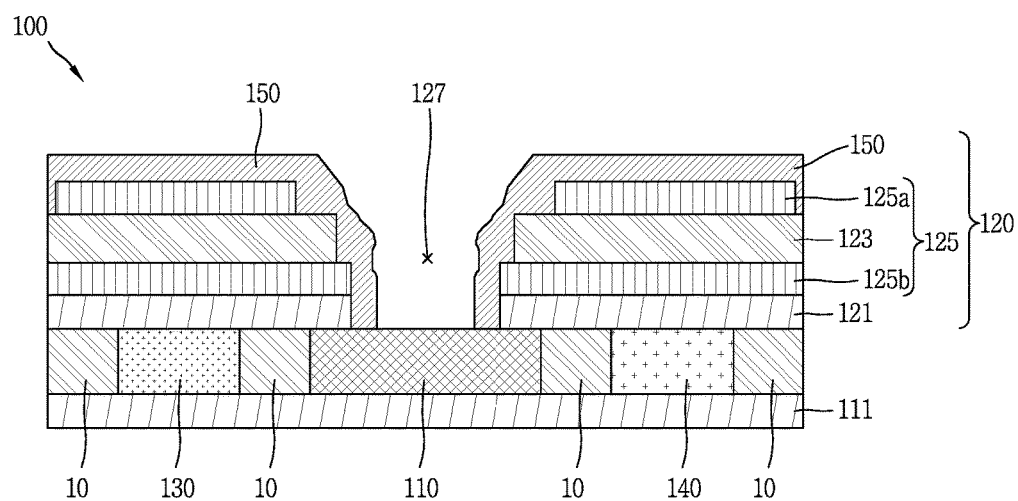
FIG. 6 is a side sectional view of a flexible sensor module including a solar cell according to still another embodiment of the present invention.
Figure 7:
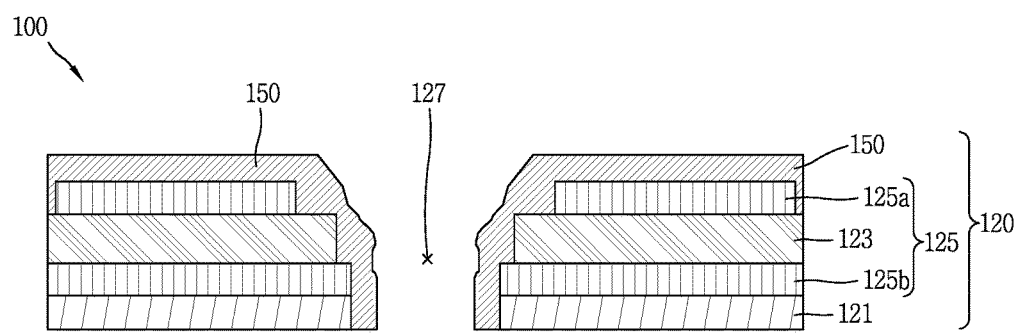
FIG. 7 is a side sectional view illustrating a structure of the solar cell included in the flexible sensor module of FIG. 6.

FIG. 6 is a perspective view illustrating a flexible sensor module 100 according to another embodiment of the present invention, which shows a through hole 127. And FIG. 7 illustrates a structure of a solar cell 120 having the through hole 127.

The flexible sensor module 100 includes a sensing unit 110, a solar cell 120, a wireless communication unit 130 and a chemical cell 140. The components are laminated on a substrate. The sensing unit 110, the wireless communication unit 130 and the chemical cell 140 may be disposed on a first substrate 111, and the solar cell 120 may be disposed on the sensing unit 110, the wireless communication unit 130 and the chemical cell 140. Positions of the sensing unit 110, the wireless communication unit 130 and the chemical cell 140 are not limited to the positions of FIG. 6. That is, the positions of the sensing unit 110, the wireless communication unit 130 and the chemical cell 140 may be interchanged with each other.

Since the substrate of the flexible sensor module 100 has a flexible characteristic, the flexible sensor module 100 may be mounted to a wall surface or a device each having a curved surface.

The sensing unit 110 is disposed on the first substrate 111. The sensing unit 110 is exposed to the outside via the through hole 127, thereby measuring at least one of a temperature, a humidity, a gas concentration and an illuminance of the outside. Explanations of the sensing unit 110 will be replaced by the aforementioned ones.

The wireless communication unit 130, disposed on the first substrate 111, may be positioned on the same plane as the sensing unit 110 or below the sensing unit 110. The chemical cell 140 may be disposed on the same plane together with the sensing unit 110, or may be disposed below the sensing unit 110. As shown in FIG. 6, the sensing unit 110, the wireless communication unit 130 and the chemical cell 140 are disposed on the first substrate 111. The sensing unit 110, the wireless communication unit 130 and the chemical cell 140 may be fixed to specific positions on the first substrate 111 by a bonding material 10 interposed therebetween.

As shown in FIGS. 6 and 7, the solar cell 120 is disposed above the sensing unit 110, and the sensing unit 110 is exposed to the outside via the through hole 127 of the solar cell 120. The solar cell 120 includes a second substrate 121, a compound layer 123, a metallic electrode 125, and a through hole 127 formed to pass through them.

The second substrate 121 is disposed to face the first substrate 111. The second substrate 121 supports the metallic electrode 125 and the compound layer 123 thereon. The second substrate 121 is configured to connect the sensing unit 110, the wireless communication unit 130 and the chemical cell 140 to each other through a copper electrode disposed thereat, the sensing unit 110, the wireless communication unit 130 and the chemical cell 140 disposed below the second substrate 121. The compound layer 123, disposed on the second substrate 121, is formed as a layer of a compound of one element of group 3 and another element of group 5. Gallium (Ga) may be used as an element of group 3, and arsenic (As) may be used as an element of group 5. The metallic electrode 125, formed on the compound layer 123, includes an upper metallic electrode 125a and a lower metallic electrode 125b.

FIG. 8A illustrates that the upper metallic electrode 125a is formed around a sensor A exposed to the outside via the through hole 127, and FIG. 8B illustrates that the upper metallic electrode 125a is formed around sensors A, B and C exposed to the outside via the through hole 127.

The upper metallic electrode 125a is disposed on the compound layer 123, and includes a finger 125a" and a busbar 125a'. The finger 125a" is indicated by a plurality of dotted lines which extend in a horizontal direction, and the busbar 125a' is indicated by a plurality of dotted lines which extend in a vertical direction and which are formed at two ends of the finger 125a". The finger 125a" contacts the compound layer 123 at a wide area, and receives a current generated from the compound layer 123. The busbar 125a' is connected to the finger 125a", and receives a current generated from the compound layer 123 through the finger 125a".

The lower metallic electrode 125b is disposed between the second substrate and the compound layer 123, and is disposed on an opposite side to the upper metallic electrode 125a on the basis of the compound layer 123.

The upper metallic electrode 125a and the lower metallic electrode 125b serve as electrodes which form electrons and holes on front and rear surfaces of the compound layer 123, in order to collect charges formed by light. In the present invention, the upper metallic electrode 125a forms an 'n' layer, and the lower metallic electrode 125b forms a 'p' layer.

The upper metallic electrode 125a and the lower metallic electrode 125b are formed by using a metallic paste. The upper metallic electrode 125a is formed by using an aluminum (Al) paste, and the lower metallic electrode 125b is formed by using a silver (Ag) paste.

Once solar energy is irradiated to the solar cell 120, a photoelectric effect is generated by a reciprocal operation among the compound layer 123, the upper metallic electrode 125a and the lower metallic electrode 125b, and thus an electromotive force is generated. The generated electromotive force is stored in the chemical cell 140 or is connected to a device which requires a power.

As shown in FIG. 7, the solar cell 120 is arranged such that the second substrate 121, the lower metallic electrode 125b, the compound layer 123 and the upper metallic electrode 125a are sequentially laminated, at both sides on the basis of the through hole 127, in a facing manner. The through hole 127 is formed to pass through upper and lower parts of the solar cell 120, such that the sensing unit 110 is exposed to the outside. The through hole 127 may have any shape if the sensing unit 110 is exposed to the outside therethrough.

The sensing unit 110 may be exposed to the outside via the through hole 127 of the solar cell 120, and may measure external environment information. In the case of forming the sensing unit 110 under the solar cell 120 and exposing the sensing unit 110 via the through hole 127, it is more advantageous in the aspect of module arrangement and space utilization, than in a case of forming the sensing unit 110 on the solar cell 120. Further, in case of using a single substrate, a dead area which may occur from the substrate may be minimized.

The through hole 127 of the solar cell 120 may be formed at any position. However, the through hole 127 is preferably formed such that the sensing unit 110 is exposed to the outside via the through hole at a central region of the solar cell 120, since the metallic electrode 125 of the solar cell 120 should be formed in a symmetrical manner on the basis of the through hole 127 for high power generation efficiency.

The solar cell 120, the sensing unit 110, the wireless communication unit 130 and the chemical cell 140 may be connected to each other through connection lines formed on the first and second substrates 111, 121. And the chemical cell 140 and the solar cell 120 supply a power to each of the components. The connection lines are generally formed of a metallic material, especially, copper.

FIG. 9 is a conceptual view illustrating a connection state of the solar cell 120, the sensing unit 110, the wireless communication unit 130 and the chemical cell 130.

Referring to FIG. 9, the solar cell 120 is connected to the chemical cell 140, and the chemical cell 140 is configured to store therein a power generated from the solar cell 120. The solar cell 120 and the chemical cell 140 are connected to the sensing unit 110 and the wireless communication unit 130, respectively. The sensing unit 110 and the wireless communication unit 130 are provided with the power from the solar cell 120 in a light environment. On the other hand, in a no-light environment, the sensing unit 110 and the wireless communication unit 130 are provided with the power stored in the chemical cell 140 after being used to charge the chemical cell 140. Referring to FIG. 9, the connection lines may be formed in plurality in number, such that the connected state of the components may be maintained even if one of the connection lines is disconnected.

The flexible sensor module 100 may further include a signal amplifier (not shown) formed on the first substrate 111 together with the sensing unit 110 and the chemical cell 140, and configured to amplify a signal measured by the sensing unit 110. The signal amplifier (not shown) may have any structure and any shape.

The flexible sensor module 100 may further include a sealing unit 150 configured to cover the solar cell 120 in order to prevent the solar cell 120 from being exposed to the outside. Explanations of the sealing unit 150 will be replaced by the aforementioned ones.

The sensing unit 110, configured to measure external environment information in an exposed state to the outside, should not have its exposed state restricted due to the sealing unit 150. Accordingly, as shown in FIGS. 6 and 7, the sealing unit 150 covers each component of the solar cell 120 with exposing the sensing unit 110 to the outside. Accordingly, as shown in FIGS. 8A and 8B, the sensing unit, exposed to the outside via the single through hole 127 of the solar cell 120, may measure external environment information.

The flexible sensor module 100 may have an optimized configuration and high efficiency, since the sensing unit 110 is exposed to the outside via the through hole 127 of the solar cell 120. Further, the flexible sensor module 100 may be bent due to its flexible characteristic, and may be easily mounted even to a curved surface due to its small thickness. The sensing unit 110 may measure a gas concentration, an illuminance, a temperature, a humidity, etc. according to a type of a sensor mounted thereto, and may transmit the sensing information to a smart phone, a notebook, a tablet PC and a computer each having a reception function, through the wireless communication unit 130.

So far, the structure of the flexible sensor module 100 and the operation of each component have been explained. Hereinafter, a method of manufacturing the flexible sensor module 100 having the through hole 127 will be explained with reference to FIG. 10 and FIGS. 11A to 11D.

FIG. 10 is a conceptual view illustrating a method of manufacturing the flexible sensor module 100 having the through hole 127. The method of FIG. 10 may be also applicable to manufacture the flexible sensor module 100 of FIG. 2 which is not provided with the through hole 127.

The flexible sensor module 100 may be manufactured through first to fourth steps.

Figure 11A:
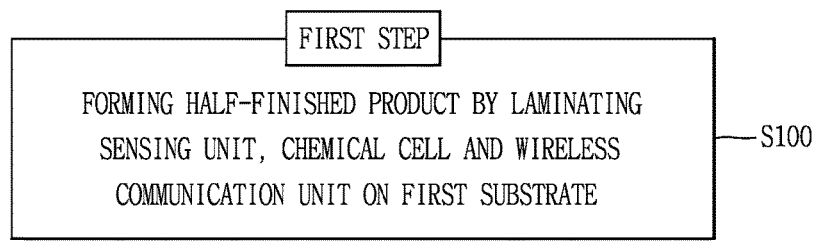
FIGS. 11A to 11D are flowcharts illustrating each step of a method of manufacturing a flexible sensor module.

Referring to FIG. 10 (the upper left drawing) and FIG. 11A, the sensing unit 110, the chemical cell 140 and the wireless communication unit 130 are laminated on the first substrate 111, thereby forming a half-finished product (first step). As aforementioned with reference to FIG. 6, the sensing unit 110, the chemical cell 140 and the wireless communication unit 130 are disposed on the same plane, and the bonding material 10 is interposed therebetween.

Figure 11B:
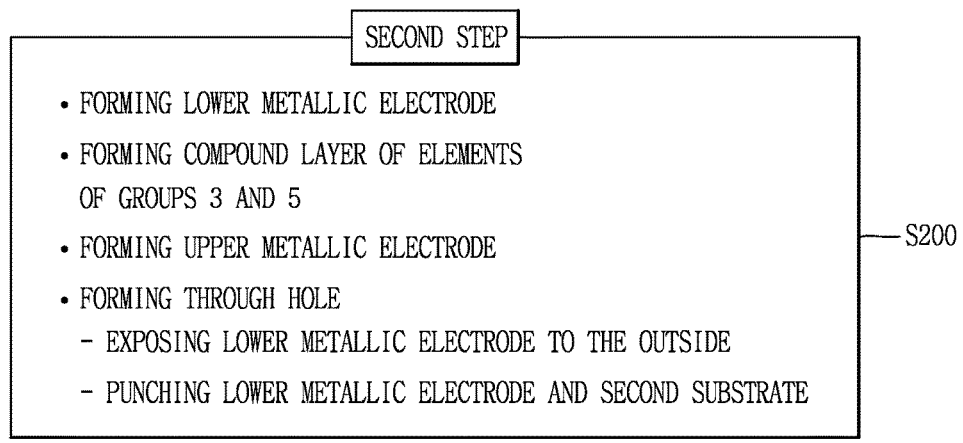

Referring to FIG. 10 (the upper right drawing) and FIG. 11B, the solar cell 120 is formed (second step). The second step includes forming the lower metallic electrode 125b on the second substrate 121, forming the compound layer 123 of elements of groups 3, 5 on the lower metallic electrode 125b, forming the upper metallic electrode 125a on the compound layer 123 of elements of groups 3, 5, and forming the through hole 127 so as to pass through the second substrate 121, the lower metallic electrode 125b, the compound layer 123 of elements of groups 3, 5 and the upper metallic electrode 125a.

As shown in FIG. 10, the forming the through hole 127 includes a step of exposing the lower metallic electrode 125b to the outside by removing part of the compound layer 123 of elements of groups 3, 5 exposed to the outside in a chemical manner, and a step of exposing the sensing unit 110 to the outside by punching the lower metallic electrode 125b and the second substrate 121. The forming the through hole 127 to expose the sensing unit 110 to the outside may be implemented by punching the lower metallic electrode 125b and the second substrate 121, using a laser, a cutter or a punch.

That is, the through hole 127 may be formed at the solar cell 120 by removing the compound layer 123 exposed between the upper metallic electrodes 125a in a chemical manner, and by punching the lower metallic electrode 125b and the second substrate 121, using a laser, a cutter or a punch.

Figure 11C:
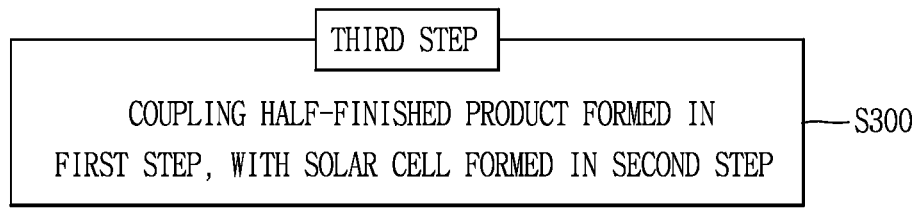

Referring to FIGS. 10 and 11C, the solar cell 120 is coupled onto the half-finished product after firstly forming the half-finished product and then forming the solar cell 120, or the solar cell 120 is coupled onto the half-finished product after firstly forming the solar cell 120 and then forming the half-finished product.

The third step of coupling the half-finished product with the solar cell 120 may mean coupling the solar cell 120 onto the half-finished product after firstly forming the half-finished product in the first step and then forming the solar cell 120 in the second step. Alternatively, the third step may mean coupling the solar cell 120 onto the half-finished product after firstly forming the solar cell 120 in the second step and then forming the half-finished product in the first step. Still alternatively, the third step may mean coupling the solar cell 120 onto the half-finished product after simultaneously forming the half-finished product in the first step and the solar cell 120 in the second step.

Figure 11D:
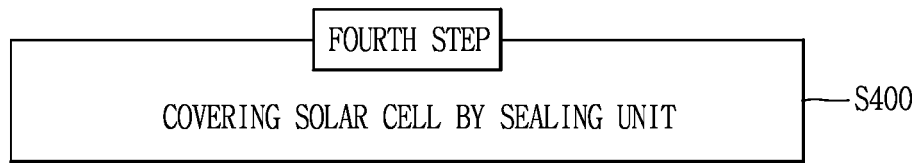

Referring to FIGS. 10 and 11D, the sealing unit 150 is disposed to cover the solar cell 120, for prevention of contact between the solar cell 120 coupled onto the half-finished product and air (fourth step). The sealing unit 150 has the same characteristic as that of the flexible sensor module 100 aforementioned.

The flexible sensor module 100 may be manufactured through the first to fourth steps shown in FIG. 10.

The configurations and methods of the flexible sensor module and the method of manufacturing the same in the aforesaid embodiments may not be limitedly applied, but such embodiments may be configured by a selective combination of all or part of the embodiments so as to implement many variations.

The present invention may have the following advantages.

Firstly, since the flexible sensor module includes the solar cell of high efficiency, it may be provided with energy for driving, from the solar cell. Further, the flexible sensor module may be mounted even to a curved surface, owing to its flexible characteristic.

Further, the flexible sensor module may have an integrated configuration and a smaller size through an enhanced structure thereof.

Further, the flexible sensor module having the through hole may execute its function without having a size increase, by exposing the sensing unit to the outside.

The configurations and methods of the mobile terminal in the aforesaid embodiments may not be limitedly applied, but such embodiments may be configured by a selective combination of all or part of the embodiments so as to implement many variations.

What is claimed is:

1. A flexible sensor module, comprising:
    a sensing unit formed on a first substrate so as to be exposed to the outside, and configured to measure external environment information;
    a solar cell disposed on the first substrate, and configured to generate a power by receiving light;
    a wireless communication unit disposed at one side on the first substrate, and configured to transmit the information measured by the sensing unit to an external server; and
    a chemical cell disposed at another side on the first substrate, charged by receiving the power from the solar cell, and configured to supply the power to the sensing unit and the wireless communication unit,
    wherein the solar cell includes:
    a compound layer disposed on the second substrate, and configured to generate the power to be supplied to the sensing unit by receiving light; and a metallic electrode formed on the compound layer.

2. The flexible sensor module of claim 1, wherein the sensing unit, the solar cell, the wireless communication unit, and the chemical cell are disposed at different positions on the first substrate.

3. The flexible sensor module of claim 1, wherein the solar cell is disposed on at least one of the wireless communication unit and the chemical cell, in order to absorb light in an exposed state to the outside.

4. The flexible sensor module of claim 1, wherein the metallic electrode connects the solar cell, the sensing unit, the wireless communication unit, and the chemical cell to each other, and
wherein the metallic electrode includes:
an upper metallic electrode formed on the compound layer; and
a lower metallic electrode disposed between the second substrate and the compound layer, and disposed on an opposite side to the upper metallic electrode on the basis of the compound layer.

5. The flexible sensor module of claim 1, wherein the sensing unit measures at least one of a temperature, a humidity, a gas concentration and an illuminance of the outside, in an exposed state to the outside.

6. The flexible sensor module of claim 5, wherein the compound layer is formed as a layer of a compound of one element of group 3 and another element of group 5.

7. The flexible sensor module of claim 6, wherein the elements of group 3 and group 5 are formed as gallium (Ga) and arsenic (As).

8. A flexible sensor module, comprising:
a sensing unit formed on a first substrate, and configured to measure external environment information;
a solar cell disposed on the sensing unit;
a wireless communication unit disposed on the first substrate together with the solar cell, and configured to transmit information measured by the sensing unit to an external server; and
a chemical cell disposed on the first substrate together with the wireless communication unit, charged by receiving a power from the solar cell, and configured to supply the power to the sensing unit and the wireless communication unit,
wherein the solar cell includes:
a second substrate disposed to face the first substrate;
a compound layer disposed on the second substrate, and configured to generate the power to be supplied to the sensing unit by receiving light;
a metallic electrode formed on the compound layer; and
one or more through holes formed to pass through upper and lower parts of the solar cell, such that the sensing unit is exposed to the outside.

9. The flexible sensor module of claim 8, wherein the metallic electrode connects the solar cell, the sensing unit, the wireless communication unit, and the chemical cell to each other, and
wherein the metallic electrode includes:
an upper metallic electrode formed on the compound layer; and
a lower metallic electrode disposed between the second substrate and the compound layer, and disposed on an opposite side to the upper metallic electrode on the basis of the compound layer.

10. The flexible sensor module of claim 8, wherein the solar cell is disposed such that the second substrate, the lower metallic electrode, the compound layer and the upper metallic electrode are sequentially laminated, at both sides on the basis of the through hole, in a facing manner.

11. The flexible sensor module of claim 8, wherein the sensing unit measures at least one of a temperature, a humidity, a gas concentration and an illuminance of the outside, in an exposed state to the outside via each of the through holes.

12. The flexible sensor module of claim 8, further comprising a sealing unit configured to cover the solar cell in order to prevent the solar cell from being exposed to the outside.

13. The flexible sensor module of claim 8, further comprising a signal amplifier formed on the first substrate together with the sensing unit, and configured to amplify a signal measured by the sensing unit.

14. A method of manufacturing a flexible sensor module, the method comprising:
a first step of forming a half-finished product by laminating a sensing unit, a chemical cell and a wireless communication unit on a first substrate; and
a second step of forming a solar cell,
wherein the second step includes:
forming a lower metallic electrode on a second substrate facing the first substrate;
forming a compound layer of one element of group 3 and another element of group 5, on the lower metallic electrode;
forming an upper metallic electrode on the compound layer of elements of groups 3, 5, such that part of the compound layer of elements of groups 3, 5 is exposed to the outside; and
forming a through hole so as to pass through the second substrate, the lower metallic electrode, the compound layer of elements of groups 3, 5, and the upper metallic electrode which are laminated on each other,
wherein the method further includes a third step of coupling the solar cell onto the half-finished product after firstly forming the half-finished product and then forming the solar cell, or after firstly forming the solar cell and then forming the half-finished product.

15. The method of claim 14, wherein the forming a through hole includes:
a step of exposing the lower metallic electrode to the outside by removing part of the compound layer of elements of groups 3, 5 exposed to the outside; and
a step of exposing the sensing unit to the outside by punching the lower metallic electrode and the second substrate.

16. The method of claim 15, further comprising a fourth step of covering the solar cell by a sealing unit, for prevention of contact between the solar cell coupled onto the half-finished product and air.

* * * * *